(12) United States Patent
Takiguchi et al.

(10) Patent No.: US 12,155,012 B2
(45) Date of Patent: Nov. 26, 2024

(54) NANOWIRE OPTICAL DEVICE

(71) Applicant: Nippon Telegraph and Telephone Corporation, Tokyo (JP)

(72) Inventors: Masato Takiguchi, Tokyo (JP); Masaya Notomi, Tokyo (JP); Satoshi Sasaki, Tokyo (JP); Kota Tateno, Tokyo (JP); Atsushi Yokoo, Tokyo (JP); Guoqiang Zhang, Tokyo (JP); Sergent Sylvain, Tokyo (JP); Akihiko Shinya, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 869 days.

(21) Appl. No.: 17/293,399

(22) PCT Filed: Oct. 31, 2019

(86) PCT No.: PCT/JP2019/042779
§ 371 (c)(1),
(2) Date: May 12, 2021

(87) PCT Pub. No.: WO2020/100611
PCT Pub. Date: May 22, 2020

(65) Prior Publication Data
US 2021/0408336 A1    Dec. 30, 2021

(30) Foreign Application Priority Data
Nov. 14, 2018   (JP) .................................. 2018-213551

(51) Int. Cl.
*G02B 6/122*   (2006.01)
*G02B 6/12*    (2006.01)
(Continued)

(52) U.S. Cl.
CPC ............ *H01L 33/387* (2013.01); *G02B 6/122* (2013.01); *H01L 33/06* (2013.01); *H01L 33/42* (2013.01);
(Continued)

(58) Field of Classification Search
None
See application file for complete search history.

(56) References Cited

U.S. PATENT DOCUMENTS 7,474,811 B1 * 1/2009 Quitoriano ........... G02B 6/1225
385/129
2008/0315229 A1 12/2008 Yi et al.
(Continued)

FOREIGN PATENT DOCUMENTS

JP     2009505415 A    2/2009
JP     2009088481 A    4/2009
(Continued)

OTHER PUBLICATIONS

Takiguchi et al. "Continuous-wave operation and 10-Gb/s direct modulation of InAsP/InP sub-wavelength nanowire laser on silicon photonic crystal" APL Photonics, vol. 2, No. 4, 2017, 11 pages.

*Primary Examiner* — Nishath Yasmeen
(74) *Attorney, Agent, or Firm* — Slater Matsil, LLP

(57) ABSTRACT

A nanowire optical device includes: a photonic crystal body having a planar shape and provided on a base part; an optical waveguide by a line defect in which a plurality of defects including a part without grating elements of the photonic crystal body are linearly arrayed; a trench formed in a waveguide direction in the optical waveguide; a nanowire made of a semiconductor and arranged in the trench; an n-type region formed on one end side of the nanowire; a p-type region formed on the other end side of the nanowire; an active region provided to be interposed between the n-type region and the p-type region in the nanowire; a first
(Continued)

electrode connected to the n-type region; and a second electrode connected to the p-type region.

11 Claims, 7 Drawing Sheets

(51) Int. Cl.
*H01L 33/06* (2010.01)
*H01L 33/38* (2010.01)
*H01L 33/42* (2010.01)
*H01S 5/10* (2021.01)
*H01S 5/30* (2006.01)
*B82Y 20/00* (2011.01)

(52) U.S. Cl.
CPC ............... *H01S 5/10* (2013.01); *H01S 5/30* (2013.01); *B82Y 20/00* (2013.01); *G02B 2006/12107* (2013.01)

(56) References Cited

U.S. PATENT DOCUMENTS

| | | | |
|---|---|---|---|
| 2009/0072249 A1 | 3/2009 | Fudeta | |
| 2010/0226609 A1 | 9/2010 | Tokushima | |
| 2012/0149178 A1* | 6/2012 | Fedeli | ............... G02F 1/025 |
| | | | 257/E21.09 |
| 2018/0372960 A1* | 12/2018 | Wohlfeil | ............... G02B 6/30 |
| 2019/0250434 A1* | 8/2019 | Debnath | ............... G02F 1/025 |
| 2023/0121108 A1* | 4/2023 | Gatzmann | ............ H01S 5/2045 |
| | | | 372/45.01 |

FOREIGN PATENT DOCUMENTS

| | | |
|---|---|---|
| JP | 2014027168 A | 2/2014 |
| JP | 2016115783 A | 6/2016 |
| JP | 2016154164 A | 8/2016 |
| JP | 2018032751 A | 3/2018 |
| WO | 2007074876 A | 7/2007 |

\* cited by examiner

NANOWIRE OPTICAL DEVICE

CROSS-REFERENCE TO RELATED APPLICATIONS

This application is a national phase entry of PCT Application No. PCT/JP2019/042779, filed on Oct. 31, 2019, which claims priority to Japanese Application No. 2018-213551, filed on Nov. 14, 2018, which applications are hereby incorporated herein by reference.

TECHNICAL FIELD

The present invention relates to a nanowire optical device, and more specifically relates to a nanowire optical device including a nanowire made of a semiconductor.

BACKGROUND

A nanowire including a semiconductor is drawing attention as an optical element having an extremely small one-dimensional structure. The nanowire can be manufactured with various semiconductor materials, and in a light emitting element, an emission wavelength can be freely changed. In addition, since the nanowire can be a pin structure or a quantum well/quantum dot embedded structure, the nanowire is applicable to a laser, a single photon source, a light receiver, and the like. In recent years, integration of growing the nanowire by a compound semiconductor on a silicon substrate applicable to a CMOS (Complementary metal oxide silicon) technology has been studied, and applications to a photoelectric fusion type processor, an on-chip high sensitivity sensor, and the like, for which the nanowire is integrated in an arbitrary location of a silicon optical waveguide have been expected.

The nanowire can be turned into a single mode waveguide by appropriately designing a wire diameter. In addition, the nanowire can be made to operate as a laser by utilizing end face reflection. Further, by utilizing an effect of an antenna that the structure of the nanowire has, an application to an optical element such as a photodetector is also possible. However, the operation by the nanowire alone has problems that a threshold of laser oscillation becomes high since a resonator Q value is small and multi-mode oscillation occurs or the like. Therefore, recently, single mode oscillation of a nanowire laser or the like has been achieved by combining a two-dimensional photonic crystal in which an optical characteristic can be freely controlled and an optical confinement effect is great and a compound nanowire (see Non-Patent Literature 1).

In this technology, as illustrated in FIG. 9A and FIG. 9B, a hybrid structure is attained by manufacturing an optical waveguide 502 by a line defect on a two-dimensional photonic crystal body 501 and arranging a nanowire 504 in a trench 503 formed in the optical waveguide 502. The two-dimensional photonic crystal body 501 includes, as is well known, a planar base part 505 and a plurality of grating elements 506 cyclically provided on the base part 505. For example, using a probe 521 of an atomic force microscope, the nanowire 504 is arranged in the trench 503. At a position of the trench 503 where the nanowire 504 is arranged, light is strongly confined.

In order to arrange the above-described nanowire at a predetermined position, the nanowire is arranged on a substrate first. Examples of the technique are application by an ink jet and a method by a micromanipulator. In addition, in order to arrange the nanowire arranged on the substrate in the trench, the nanowire is manipulated using the above-described atomic force microscope, optical tweezers, the micromanipulator or the like. Further, it is also possible to attain a state where the nanowire is arranged in the trench by growing a nanowire of a different material directly on a silicon substrate. The above-described technique of arranging the nanowire in the trench of the photonic crystal is successful to some degree at a point that observation of laser oscillation and a quantum optical Forming an appropriate electrode structure and introducing, for example, a current injection structure to such a nanowire optical device including the photonic crystal is important to achieve a future on-chip optical integrated element or the like. When the nanowire is used, since capacitance of the nanowire itself is extremely small, the nanowire optical device can be operated at a high speed.

CITATION LIST

Non-Patent Literature

Non-Patent Literature 1: M. Takiguchi, A. Yokoo, K. Nozaki, M. D. Birowosuto, K. Tateno, G. Zhang, E. Kuramochi, A. Shinya, and M. Notomi, "Continuous-wave operation and 10-Gb/s direct modulation of InAsP/InP sub-wavelength nanowire laser on silicon photonic crystal", APL Photonics, vol. 2, no. 4, 046106, 2017.

SUMMARY

Technical Problem

However, when an electrode is formed in the nanowire optical device, there is a problem of inviting waveguide loss in an optical waveguide structure where the nanowire is arranged. Here, a constitution of providing the electrode of the nanowire optical device will be described with reference to FIG. 10.

Similarly to the photonic crystal body 501 described using FIG. 9A and FIG. 9B, the nanowire optical device includes the optical waveguide 502 provided on the photonic crystal body 501, the trench 503 formed in the optical waveguide 502 and the nanowire 504 arranged in the trench 503. The photonic crystal body 501 includes the planar base pall 505 and the plurality of grating elements 506.

In addition, an n-type region 507 is formed on one end side of the nanowire 504, and a p-type region 508 is formed on the other end side of the nanowire 504. The n-type region 507 and the p-type region 508 are formed by introducing respectively corresponding impurities. Further, in a region interposed between the n-type region 507 and the p-type region 508 in the nanowire 504, an active region 509 is formed. The active region 509 is turned to a multiple quantum well structure, for example.

In addition, a first electrode 510 made of a metal is connected to the n-type region 507, and a second electrode 511 made of the metal is connected to the p-type region 508. By connecting the first electrode 510 and the second electrode 511 to a power source (not shown) and making a current flow through the nanowire 504 for injecting a carrier to the active region 509, the active region 509 can be made to emit light.

In the above-described nanowire optical device, for example, when light generated in the active region 509 is to be guided by the optical waveguide 502, the light is absorbed in the first electrode 510 and the second electrode 511 made of the metal, and loss of guided light is generated.

Thus, a bypass optical waveguide 502a by a line defect is provided, and the light generated in the active region 509 is guided by the bypass optical waveguide 502a and taken out.

However, even when the bypass optical waveguide 502a is used, the loss of the guided light by the bypass optical waveguide 502a in a bending structure is generated and there are such problems that a band of the guided light becomes narrow and the like. In addition, in order to suppress absorption of the light by the electrode made of the metal, the electrode needs to be separated more from the active region 509. However, when a distance between the electrode and the active region 509 becomes longer, a resistance value between the active region 509 and the electrode becomes higher and efficiency of current injection declines.

Embodiments of the present invention have been made in order to solve the problems described above, and it is an object of embodiments of the present invention to suppress loss of light in a nanowire optical device without increasing an interval between an active region and an electrode.

Means for Solving the Problem

A nanowire optical device relating to embodiments of the present invention includes: a photonic crystal body having a planar shape and including a base part and a plurality of columnar grating elements having a refractive index different from the refractive index of the base part, the plurality of grating elements being cyclically provided at intervals equal to or shorter than a wavelength of object light on the base part; an optical waveguide by a line defect in which a plurality of defects including a part without the grating elements of the photonic crystal body are linearly arrayed; a trench formed in a waveguide direction in the optical waveguide; a nanowire made of a semiconductor and arranged in the trench; an n-type region formed on one end side of the nanowire; a p-type region formed on the other end side of the nanowire; an active region provided to be interposed between the n-type region and the p-type region in the nanowire; a first electrode connected to the n-type region; and a second electrode connected to the p-type region, and at least one of a region of the first electrode in contact with the n-type region and a region of the second electrode in contact with the p-type region includes a transparent electrode material.

In one configuration example of the nanowire optical device according to claim 1, the trench is formed wider than a width of the nanowire, in the region including the transparent electrode material of at least one of the first electrode and the second electrode, in a planar view.

In one configuration example of the nanowire optical device described above, the region including the transparent electrode material and being at least one of the region of the first electrode connected to the n-type region and the region of the second electrode connected to the p-type region is formed such that the transparent electrode material is in contact with a side face of the nanowire facing a side face of the trench in addition to an upper surface of the nanowire.

In one configuration example of the nanowire optical device described above, a width of the trench is widened as the trench extends away from the active region, in the region including the transparent electrode material of at least one of the first electrode and the second electrode, in a planar view.

In one configuration example of the nanowire optical device described above, optical confinement structures for confining light in the active region are further provided, and the optical confinement structures are formed to interpose the active region therebetween in the optical waveguide.

Effects of Embodiments of the Invention

As described above, according to embodiments of the present invention, since at least one of the region of the first electrode connected to the n-type region and the region of the second electrode connected to the p-type region includes the transparent electrode material, an excellent effect that loss of light in the nanowire optical device can be suppressed is obtained without widening an interval between the active region and the electrode.

DETAILED DESCRIPTION OF ILLUSTRATIVE EMBODIMENTS

Hereinafter, a nanowire optical device relating to the embodiment of the present invention will be described.

Embodiment 1

Figure 1A:
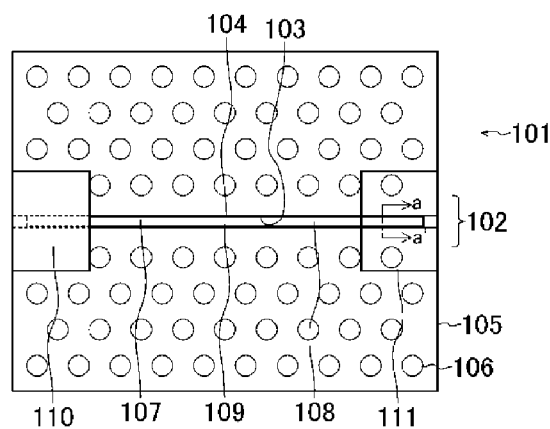
FIG. 1A is a top view illustrating a configuration of a nanowire optical device relating to an embodiment 1 of the present invention.
Figure 1B:
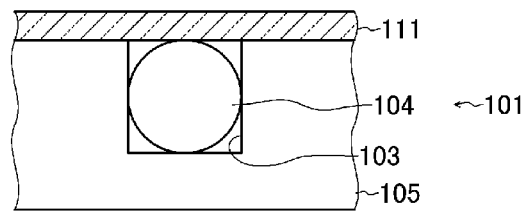
FIG. 1B is a section view illustrating the configuration of the nanowire optical device relating to the embodiment 1 of the present invention.

First, the nanowire optical device in the embodiment 1 of the present invention will be described with reference to FIG. 1A and FIG. 1B. Note that FIG. 1B illustrates a cross section of a line aa' in FIG. 1A.

The nanowire optical device includes a photonic crystal body 101, an optical waveguide 102 provided on the photonic crystal body 101, a trench 103 formed in the optical waveguide 102, and a nanowire 104 formed in the trench 103. The photonic crystal body 101 can be made of silicon for example. The nanowire 104 is made of a semiconductor. The nanowire 104 can be made of a compound semiconductor such as InP for example.

The photonic crystal body 101 includes a planar base part 105, and a plurality of grating elements 106. A refractive index of the grating element 106 is different from that of the base part 105. The base part 105 is made of InP for example, and the grating element 106 is a cylindrical through-hole for example.

The plurality of grating elements 106 are cyclically provided at an interval equal to or shorter than a wavelength of object light, and are arrayed in a triangle grating shape in a planar view for example. The optical waveguide 102 includes a line defect. For the line defect, a plurality of defects (point defects) including a part without the grating element 106 of the photonic crystal body 101 are linearly arrayed. The trench 103 extends in a waveguide direction of the optical waveguide 102 configured in such a manner.

In addition, an n-type region 107 is formed on one end side of the nanowire 104, and a p-type region 108 is formed on the other end side of the nanowire 104. The n-type region 107 and the p-type region 108 can be formed by introducing respectively corresponding impurities. Further, in a region interposed between the n-type region 107 and the p-type region 108 in the nanowire 104, an active region 109 is formed. The active region 109 has a multiple quantum well structure for example. For example, the multiple quantum well structure for which a quantum well layer made of InAsP and a barrier layer made of InP are alternately laminated in an extending direction of the nanowire 104 is formed to attain the active region 109. In a case where the active region 109 is turned to the multiple quantum well structure, the quantum well layer made of InAsP functions as an active layer.

In addition, the nanowire optical device in the embodiment 1 includes a first electrode 110 connected to the n-type region 107 and a second electrode 111 connected to the p-type region 108. The first electrode 110 is in contact with an upper surface of the n-type region 107 at an opening end of the trench 103. Further, the second electrode 111 is in contact with an upper surface of the p-type region 108 at the opening end of the trench 103. At least a region of the second electrode 111 in contact with the p-type region 108 includes a transparent electrode material. The second electrode 111 may be entirely made of the transparent electrode material. The second electrode 111 including the transparent electrode material can be arranged right above the optical waveguide 102 or on the photonic crystal body 101.

The transparent electrode material can be made of ITO (Indium Tin Oxide) or ZnO, for example. Note that at least the region of the first electrode 110 connected to (in contact with) the n-type region 107 can also include the transparent electrode material. Also in this case, the first electrode 110 may be entirely made of the transparent electrode material.

According to the embodiment 1, for example, light generated in the active region 109 is not absorbed in the second electrode 111 when guided through the optical waveguide 102 in a direction of the second electrode 111, and loss of guided light is not generated. Thus, according to the embodiment 1, since the light generated in the active region 109 can be guided in the direction of the second electrode 111 of the optical waveguide 102 without the loss of the guided light, it is not needed to introduce a bending waveguide, and there is no waveguide loss due to use of the bending waveguide.

Further, the second electrode 111 including the transparent electrode material can be arranged near the active region 109 and a resistance value between the active region 109 and the second electrode 111 can be lowered so that decline of current injection efficiency can be suppressed. In addition, at least the region of the second electrode 111 which is connected to (in contact with) the p-type region 108 and affects an optical characteristic may be made of the transparent electrode material while the other region of the second electrode 111 may be made of a metal. Though resistivity of the transparent electrode material is high compared with the metal, by limiting the part of the transparent electrode material to a position affecting the optical characteristic and making the other region of the metal, the entire resistance of the second electrode 111 can be lowered. Note that it is same for the case where the first electrode 110 includes the transparent electrode material. The light generated in the active region 109 can be also guided in the direction of the first electrode 110 of the optical waveguide 102 without the loss of the guided light.

The nanowire optical device relating to the embodiment 1 can be made to function as a light emitting element which makes the active region 109 emit light by injecting a current to the active region 109 by the first electrode 110 and the second electrode 111, for example. In addition, the nanowire optical device can be also made to function as a photodiode for which the n-type region 107, the active region 109 and the p-type region 108 are turned to a so-called pin structure.

Embodiment 2

Figure 2A:
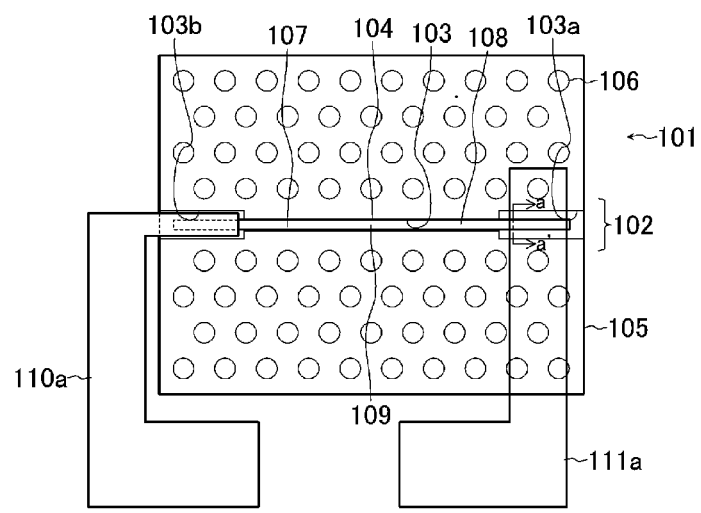
FIG. 2A is a top view illustrating the configuration of the nanowire optical device relating to an embodiment 2 of the present invention.

Next, the nanowire optical device relating to the embodiment 2 of the present invention will be described with reference to FIG. 2A and FIG. 2B. Note that FIG. 2B illustrates a cross section of a line aa' in FIG. 2A.

In the embodiment 2 as well, a first electrode 110a connected to the n-type region 107 and a second electrode 111a connected to the p-type region 108 are provided. In addition, at least the region of the second electrode 111a connected to (in contact with) the p-type region 108 includes the transparent electrode material. In the embodiment 2, in the region of the second electrode 111a which includes the transparent electrode material and is connected to the p-type region 108, a width of a trench 103a is made wider than the width of the nanowire 104. Note that, in the embodiment 2, also in the region of the first electrode 110a connected to the n-type region 107, the width of a trench 103b is made wider than the width of the nanowire 104.

Figure 2B:
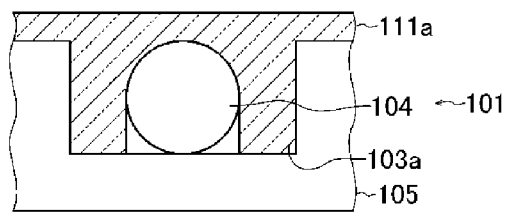
FIG. 2B is a section view illustrating the configuration of the nanowire optical device relating to the embodiment 2 of the present invention.

In addition, in the embodiment 2, as illustrated in FIG. 2B, the region including the transparent electrode material of the second electrode 111a is formed in contact with a side face of the nanowire 104 facing the side face of the trench 103a, as well as an upper surface of the nanowire 104. Note that, also in the case where the first electrode 110a includes the transparent electrode material, the region including the transparent electrode material of the first electrode 110a can be formed in contact with the side face of the nanowire 104 facing the side face of the trench 103b, as well as the upper surface of the nanowire 104.

Compared to a state where the second electrode 111a including the transparent electrode material is connected to (in contact with) the upper surface of the nanowire 104 only, since the transparent electrode material is also in contact with the side face of the nanowire 104 facing the side face of the trench 103a, the resistance value can be lowered. For example, in the case of forming the electrode by a vapor deposition method or a sputtering method, when the width of the trench 103a is made wider than the width of the nanowire 104, the electrode material can be deposited and formed on the side face of the nanowire 104 as well.

Figure 3:
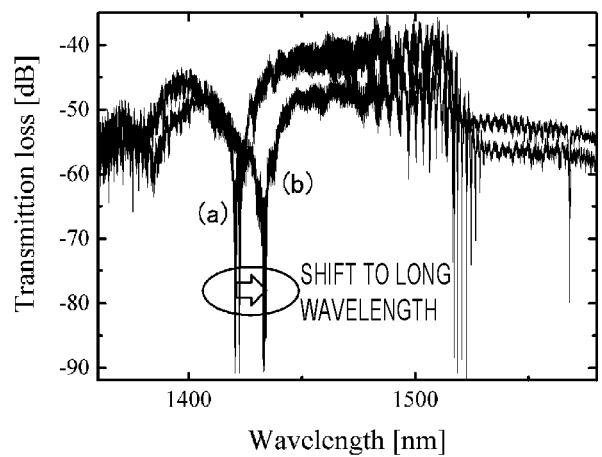
FIG. 3 is a characteristic diagram illustrating a measurement result of a wavelength shift between a case where a transparent electrode material is made of ZnO with a thickness of several nm and a width of 5 μm (b) and a case where no transparent electrode material is provided (a).

Since the transparent electrode material has a dielectric constant different from that of the photonic crystal body 101, in the optical waveguide 102 for which the nanowire 104 is arranged in the trench 103, an optical characteristic is changed by arranging the transparent electrode material. FIG. 3 illustrates a measurement result of a wavelength shift in the case where the transparent electrode material is made of ZnO with a thickness of several nm and the width of 5 μm on the nanowire 104 arranged in the trench 103 and the case where no transparent electrode material is provided. As illustrated in FIG. 3, compared to the case of not forming the transparent electrode material (a), there is only the wavelength shift to a long wavelength side of about 20 nm in the case where the transparent electrode material is provided (b). In such a manner, even when the transparent electrode material is used, the wavelength shift is small and the waveguide loss (transmission loss) is also small as described above so that the optical characteristic of the nanowire optical device is not greatly damaged.

Figure 4:
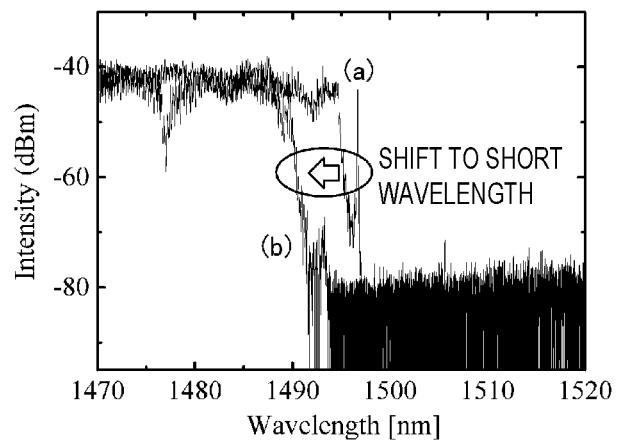
FIG. 4 is a characteristic diagram illustrating a measurement result of a wavelength shift between a trench 103 with the width of 100 nm (a) and a trench 103a with the width of 150 nm (b).

In addition, in the optical waveguide 102 for which the nanowire 104 is arranged in the trench 103, the optical characteristic is changed in the trench 103a with the wider width. FIG. 4 illustrates a measurement result of the wavelength shift between the trench 103 with the width in the planar view of 100 nm and the trench 103a with the width in the planar view of 150 nm. As illustrated in FIG. 4, compared to the trench 103 with the width of boo nm (a), the wavelength shifts only for about 10-20 nm to a short wavelength side for the trench 103a with the width of 150 nm (b). In such a manner, even when the width of the trench is widened, the wavelength shift by width widening is small so that the optical characteristic of the nanowire optical device is not greatly damaged. Further, as described above, by forming the transparent electrode material in the trench with the widened width, the wavelength shift to the short wavelength side is offset by the wavelength shift to the long wavelength side so that a transmission band is not narrowed.

Figure 5A:
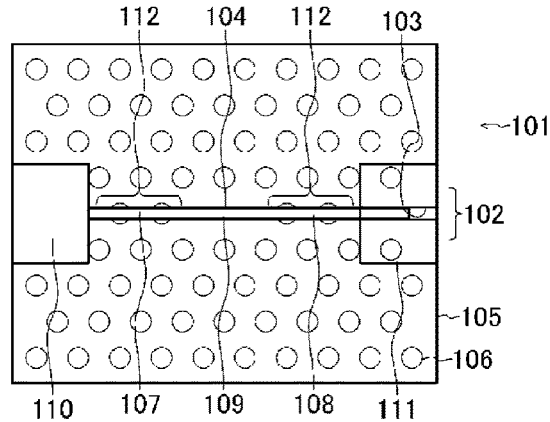
FIG. 5A is a top view illustrating the configuration of another nanowire optical device relating to the embodiment of the present invention.

While the light is strongly confined at the position where the nanowire 104 is arranged in the trench 103, in this configuration, the light is confined in the region over the entire nanowire 104. Therefore, a resonator cannot be formed and the nanowire optical device cannot be used as a laser. In contrast, as illustrated in FIG. 5A, by providing optical confinement structures 112 which confine the light in the active region 109 of the nanowire 104, the resonator can be formed.

Figure 5B:
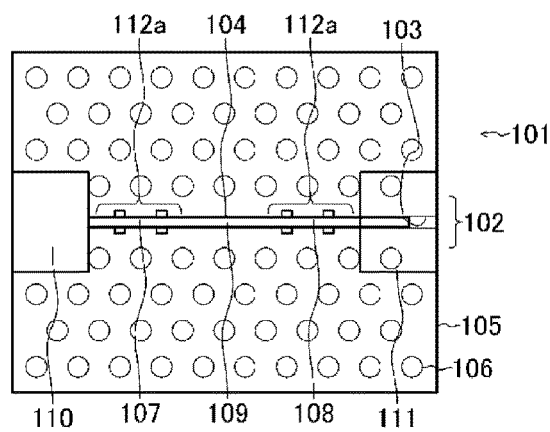
FIG. 5B is a top view illustrating the configuration of another nanowire optical device relating to the embodiment of the present invention.
Figure 5C:
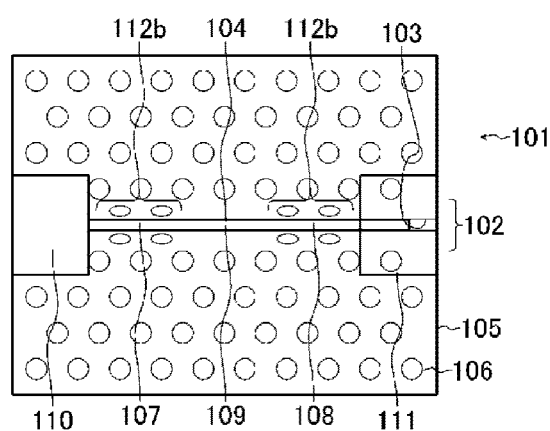
FIG. 5C is a top view illustrating the configuration of another nanowire optical device relating to the embodiment of the present invention.

For the optical confinement structures 112, columnar structures of a refractive index different from that of the base part 105 formed in the photonic crystal body 101 are cyclically arranged in a light waveguide direction. Note that, as illustrated in FIG. 5B, the optical confinement structures may be optical confinement structures 112a by rectangular parallelepiped through-holes. Also, as illustrated in FIG. 5C, the optical confinement structures may be optical confinement structures 112b by through-holes arranged between the trench 103 and a column of the grating elements 106 adjacent to the optical waveguide 102. By providing the optical confinement structures 112 in this way, a resonator Q value can be turned to a value exceeding 10000.

Figure 6:
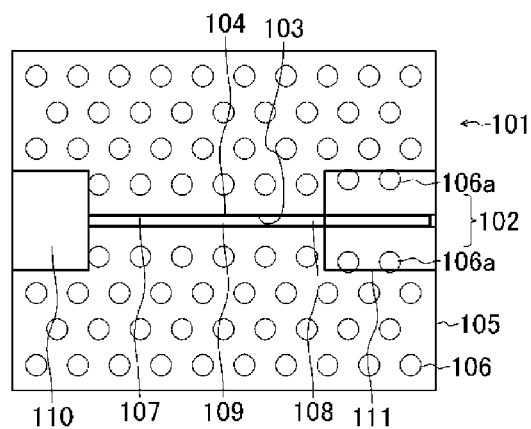
FIG. 6 is a top view illustrating the configuration of another nanowire optical device relating to the embodiment of the present invention.

In addition, as illustrated in FIG. 6, in the region where the second electrode 111 including the transparent electrode material is arranged, by shifting grating elements 106a adjacent to the trench 103 in a direction of separating from the trench 103, the optical characteristic of the region can be adjusted.

Figure 7:
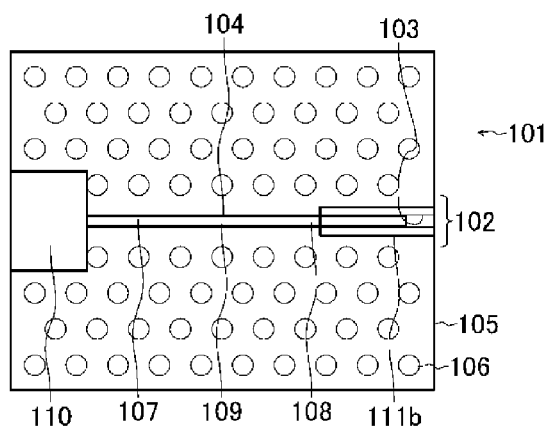
FIG. 7 is a top view illustrating the configuration of another nanowire optical device relating to the embodiment of the present invention.

As illustrated in FIG. 7, a second electrode 111b including the transparent electrode material can be arranged along the optical waveguide 102 on an inner side in a width direction in the planar view of the optical waveguide 102 in the planar view. The second electrode 111b is arranged between two columns of the grating elements 106 adjacent to the trench 103 and parallel to the optical waveguide 102.

Figure 8:
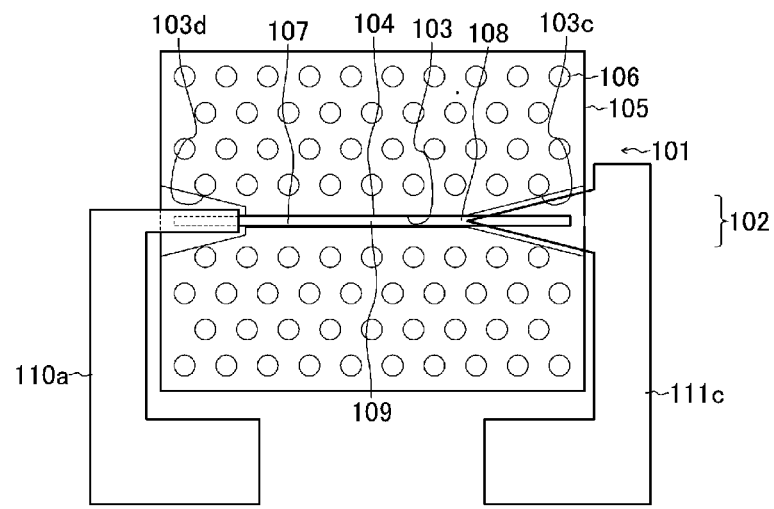
FIG. 8 is a top view illustrating the configuration of another nanowire optical device relating to the embodiment of the present invention.
Figure 9A:
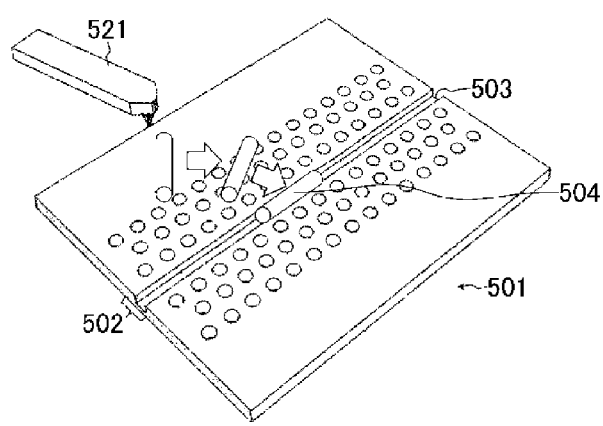
FIG. 9A is a perspective view illustrating the configuration of a conventional nanowire optical device.
Figure 9B:
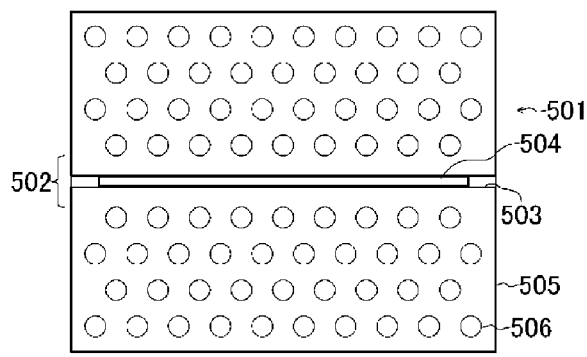
FIG. 9B is a top view illustrating the configuration of the conventional nanowire optical device.
Figure 10:
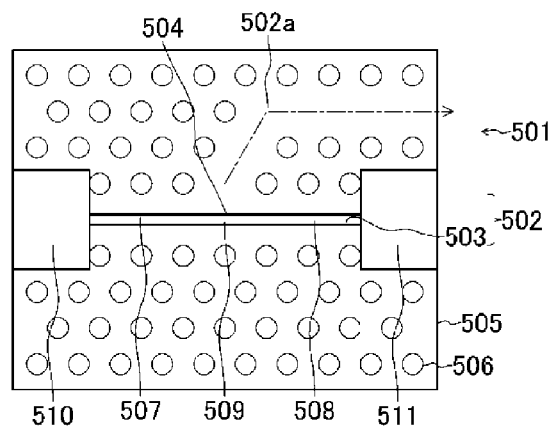
FIG. 10 is a top view illustrating the configuration of the conventional nanowire optical device.

Further, as illustrated in FIG. 8, in the region of the second electrode 111c connected to the p-type region, the width of a trench 103c can be widened as the trench 103c extends away from the active region 109 in the planar view. Similarly, in the region of the first electrode 110a connected to the n-type region 107, the width of a trench 103d can be widened as the trench 103d extends away from the active region 109 in the planar view. The trench 103c is formed in the region including the transparent electrode material of the first electrode 110a, in the planar view. The trench 103d can be also formed in the region including the transparent electrode material of the second electrode 111c, in the planar view.

As described above, according to embodiments of the present invention, since at least one of the region of the first electrode connected to the n-type region and the region of the second electrode connected to the p-type region includes the transparent electrode material, the loss of the light in the nanowire optical device can be suppressed without widening an interval between the active region and the electrode.

Note that the present invention is not limited to the embodiments described above, and many modifications and combinations can be made by those who have ordinary knowledge in this field within the technical scope of the present invention, as a matter of course.

REFERENCE SIGNS LIST

101 Photonic crystal body
102 Optical waveguide
103 Trench
104 Nanowire
105 Base part
106 Grating element
107 n-type region
108 p-type region
110 First electrode
111 Second electrode.

The invention claimed is:

1. A nanowire optical device comprising:
a photonic crystal body having a planar shape and including a base part and a plurality of columnar grating elements having a refractive index different from a refractive index of the base part, the plurality of columnar grating elements being disposed at intervals equal to or shorter than a wavelength of object light on the base part;
an optical waveguide comprising a line defect in which a plurality of defects including a part without the columnar grating elements of the photonic crystal body are linearly arrayed;

a trench extending in a waveguide direction in the optical waveguide;

a nanowire made of a semiconductor and arranged in the trench;

an n-type region on a first end side of the nanowire;

a p-type region on a second end side of the nanowire;

an active region between the n-type region and the p-type region in the nanowire;

a first electrode connected to the n-type region; and a second electrode connected to the p-type region, wherein a region of the first electrode in contact with the n-type region or a region of the second electrode in contact with the p-type region includes a transparent electrode material.

2. The nanowire optical device according to claim 1, wherein, in a planar view, the trench is wider than a width of the nanowire around the region of the first electrode or the second electrode that includes the transparent electrode material.

3. The nanowire optical device according to claim 2, wherein the transparent electrode material is in contact with a side face of the nanowire facing a side face of the trench in addition to an upper surface of the nanowire.

4. The nanowire optical device according to claim 1, wherein, in a planar view, a width of the trench increases as the trench extends away from the active region, around the region of the first electrode or the second electrode including the transparent electrode material of at least one of the first electrode and the second electrode.

5. The nanowire optical device according to claim 1 further comprising:

optical confinement structures for confining light in the active region, wherein the optical confinement structures interpose the active region therebetween in the optical waveguide.

6. A nanowire optical device comprising:

a photonic crystal body including:

a base part; and a plurality of columnar grating elements having a refractive index different from a refractive index of the base part, the plurality of columnar grating elements being disposed at intervals equal to or shorter than a wavelength of object light on the base part;

an optical waveguide;

a trench extending in a waveguide direction in the optical waveguide;

a nanowire made of a semiconductor and arranged in the trench;

an n-type region on a first end side of the nanowire;

a p-type region on a second end side of the nanowire;

an active region between the n-type region and the p-type region in the nanowire;

a first electrode connected to the n-type region; and a second electrode connected to the p-type region, wherein a region of the first electrode in contact with the n-type region or a region of the second electrode in contact with the p-type region includes a transparent electrode material.

7. The nanowire optical device according to claim 6, wherein a line defect of the optical waveguide comprises a plurality of defects including a part without the columnar grating elements of the photonic crystal body are linearly arrayed.

8. The nanowire optical device according to claim 6, wherein, in a planar view, the trench is wider than a width of the nanowire around the region of the first electrode or the second electrode that includes the transparent electrode material.

9. The nanowire optical device according to claim 6, wherein the transparent electrode material is in contact with a side face of the nanowire facing a side face of the trench in addition to an upper surface of the nanowire.

10. The nanowire optical device according to claim 6, wherein, in a planar view, a width of the trench increases as the trench extends away from the active region, around the region of the first electrode or the second electrode including the transparent electrode material of at least one of the first electrode and the second electrode.

11. The nanowire optical device according to claim 6 further comprising:

optical confinement structures for confining light in the active region, wherein the optical confinement structures interpose the active region therebetween in the optical waveguide.

* * * * *